United States Patent
Guo et al.

(10) Patent No.: US 12,527,142 B2
(45) Date of Patent: Jan. 13, 2026

(54) LED STRUCTURES AND MANUFACTURING METHODS THEREOF, LED DEVICES AND MANUFACTURING METHODS THEREOF

(71) Applicant: Enkris Semiconductor (Wuxi), Ltd., Wuxi (CN)

(72) Inventors: Zhizhong Guo, Wuxi (CN); Liyang Zhang, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 453 days.

(21) Appl. No.: 18/088,425

(22) Filed: Dec. 23, 2022

(65) Prior Publication Data

US 2023/0207609 A1    Jun. 29, 2023

(30) Foreign Application Priority Data

Dec. 29, 2021  (CN) .......................... 202111643366.7

(51) Int. Cl.
*H01L 27/14*  (2006.01)
*H01L 29/04*  (2006.01)
*H01L 29/15*  (2006.01)
*H01L 31/036*  (2006.01)
*H10H 29/14*  (2025.01)

(52) U.S. Cl.
CPC ................................ *H10H 29/142* (2025.01)

(58) Field of Classification Search
CPC .... H10H 29/142; H10H 20/855; H10H 29/14; H10H 20/01; H10H 20/8215; H10H 20/819; Y02B 20/30; H01L 25/167
See application file for complete search history.

(56) References Cited

U.S. PATENT DOCUMENTS

| 8,297,793 | B2 * | 10/2012 | Kim ..................... | H01L 25/0753 362/249.05 |
| 8,760,049 | B2 * | 6/2014 | Cha ........................ | G02B 6/009 313/512 |
| 8,981,392 | B2 * | 3/2015 | Song .................... | H01L 25/0753 257/E33.059 |
| 12,040,320 | B2 * | 7/2024 | Shin .................... | H01L 25/0753 |
| 2012/0099303 | A1 * | 4/2012 | Li .......................... | H05B 45/20 362/231 |
| 2013/0200408 | A1 * | 8/2013 | Wang .................... | H10H 29/10 257/91 |

(Continued)

*Primary Examiner* — Ismail A Muse
(74) *Attorney, Agent, or Firm* — Christopher R. Carroll; The Small Patent Law Group LLC

(57) ABSTRACT

The present disclosure provides LED structures and manufacturing methods thereof, LED devices and manufacturing methods thereof. The LED structure includes a substrate, light emitting units, first electrodes and second electrodes, and the substrate is provided with grooves with different depths. A light emitting unit is disposed in each of the grooves and includes a first semiconductor layer, a light emitting layer on the first semiconductor layer and a second semiconductor layer on the light emitting layer; light emitting layers in grooves with different depths emit different colors. A first electrode and a second electrode in each groove, the first electrode is electrically connected with the first semiconductor layer, and the second electrode is electrically connected with the second semiconductor layer.

16 Claims, 11 Drawing Sheets

(56) References Cited

U.S. PATENT DOCUMENTS

| | | | |
|---|---|---|---|
| 2013/0240832 A1* | 9/2013 | Hersee | H10D 30/4755 |
| | | | 438/23 |
| 2015/0179945 A1* | 6/2015 | Chien | H10K 59/124 |
| | | | 438/35 |
| 2017/0196060 A1* | 7/2017 | Watanabe | H10H 20/8513 |
| 2017/0318632 A1* | 11/2017 | Simin | H10H 29/10 |
| 2017/0373046 A1* | 12/2017 | Gardner | H01L 24/97 |
| 2019/0198561 A1* | 6/2019 | Wildeson | H10H 29/142 |
| 2019/0198715 A1* | 6/2019 | Lim | H10K 59/122 |
| 2020/0203556 A1* | 6/2020 | Feuillet | H10H 29/14 |
| 2020/0388722 A1* | 12/2020 | Li | H10D 62/824 |

\* cited by examiner

LED STRUCTURES AND MANUFACTURING METHODS THEREOF, LED DEVICES AND MANUFACTURING METHODS THEREOF

CROSS REFERENCE TO RELATED APPLICATIONS

This application claims priority to Chinese Patent Application No. 2021116433667 filed on Dec. 28, 2021, the entire content of which is incorporated herein by reference.

TECHNICAL FIELD

The present disclosure relates to the field of semiconductor technology, and in particular, to LED structures and manufacturing methods thereof, LED devices and manufacturing methods thereof.

BACKGROUND

In recent years, light emitting diode (LED), as a new generation of green light source, is widely used in lighting, backlight, display, indication and other fields. LED devices include a variety of light emitting structures emitting different colors. During the process of manufacturing the LED device, light emitting structures emitting different colors are firstly manufactured, and then the light emitting structures emitting different colors are transferred to a driving backplane.

In the process of manufacturing LED devices, only one LED structure emitting single color can be transferred during a single transfer process, and LED structures emitting different colors need to be transferred to the driving backplane in sequence, and the transfer efficiency is low.

SUMMARY

The first aspect of the present disclosure provides an LED structure, the LED structure includes: a substrate, where the substrate is provided with grooves, and depths of the grooves are all different; light emitting units in the grooves and each including a first semiconductor layer, a light emitting layer on the first semiconductor layer and a second semiconductor layer on the light emitting layer, where light emitting layers in different grooves with different depths emit different colors; first electrodes and second electrodes, where each of the first electrodes is electrically connected with the first semiconductor layer in each groove and each of the second electrode is electrically connected with the second semiconductor layer in each groove.

The second aspect of the present disclosure provides an LED device, the LED device includes control structures, connection wires and the above-mentioned LED structure; each of the grooves is provided with a control structure; the control structure includes a gate electrode, a source electrode and a drain electrode, and the source electrode and the drain electrode are located on both sides of the gate electrode; and in a same groove, the second electrode is connected with the source electrode through a connection wire.

A third aspect of the present disclosure provides a method of manufacturing an LED structure, including: providing a substrate, and manufacturing grooves on the substrate, where depths of the grooves are different; forming light emitting units, where a light emitting unit in each groove includes a first semiconductor layer, a light emitting layer on the first semiconductor layer and a second semiconductor layer on the light emitting layer, light emitting layers in different grooves with different depths emit different colors; forming first electrodes and second electrodes, where each of the first electrodes is electrically connected with the first semiconductor layer in each groove, and each of the second electrodes is electrically connected with the second semiconductor layer in each groove.

A fourth aspect of the present disclosure provides a method of manufacturing an LED device, including: manufacturing an intermediate structure, where the intermediate structure includes a substrate and heterojunction structures, the substrate is provided with grooves, at least two of the grooves have different depths; each of the grooves include a first region and a second region; the heterojunction structures are respectively provided in the grooves, and in each groove, the heterojunction structures are located in the first region and the second region; forming light emitting units on the heterojunction structures in the grooves, where in each groove, the light emitting unit is disposed in the first region, and the light emitting unit includes a first semiconductor layer, a light emitting layer on the first semiconductor layer and a second semiconductor layer on the light emitting layer, the first semiconductor layer is disposed on a surface of the heterojunction structure away from the substrate; the light emitting layers in different grooves with different depths emit different colors; etching the heterojunction structure in each groove to obtain a first substructure in the first region and a second substructure in the second region, where the first substructure and the second substructure in a same groove are arranged separately; the second substructure in each groove includes a gate region, and a source region and a drain region located on both sides of the gate region; forming a gate electrode, a source electrode, a drain electrode, a first electrode, a second electrode and connection wire in each groove; where the gate electrode is disposed on the gate region, the source electrode is disposed on the source region, and the drain electrode is disposed on the drain region; the first electrode in each groove is electrically connected with the first semiconductor layer, the second electrode in each groove is electrically connected with the second semiconductor layer, and in a same groove, the second electrode is electrically connected with the source electrode through the connection wire.

DETAILED DESCRIPTION

In order to make the above-mentioned objects, features and advantages of the present disclosure more obvious and understandable, embodiments of the present disclosure will be described in detail below with reference to the accompanying drawings.

First Embodiment

Figure 1:
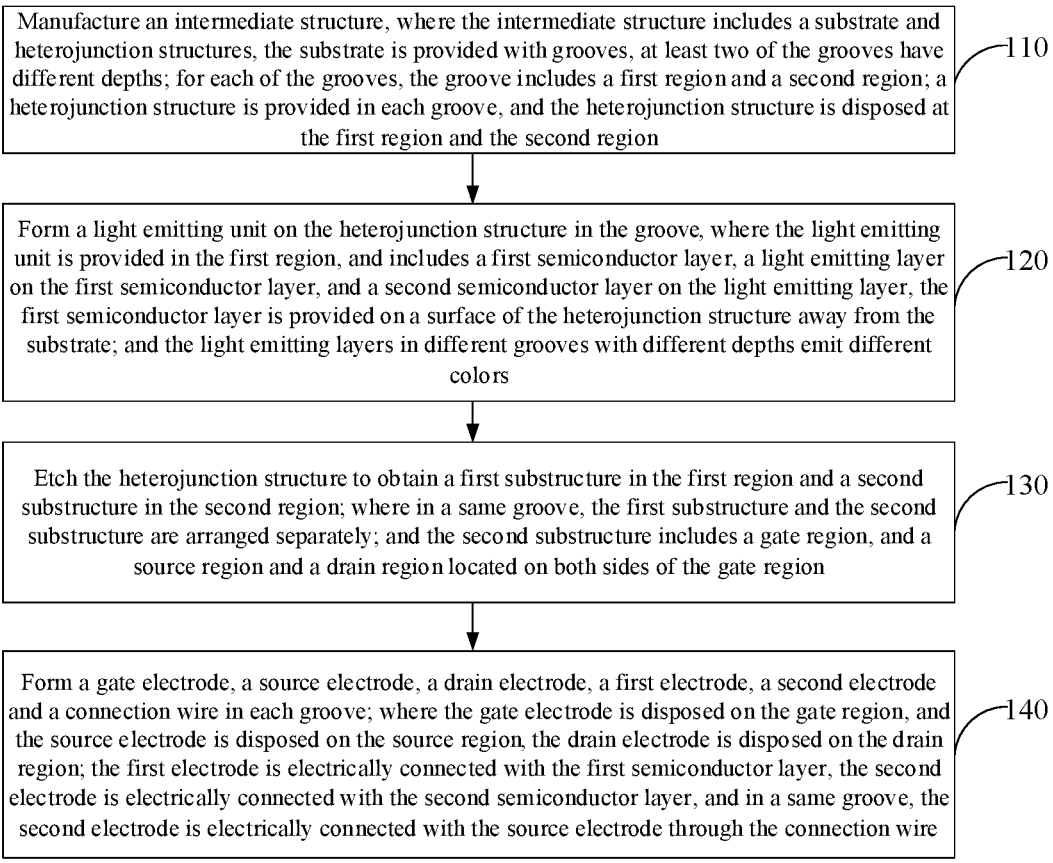
FIG. 1 is a flowchart of a method of manufacturing an LED device according to a first embodiment of the present disclosure.

The present disclosure provides a method of manufacturing an LED device. As shown in FIG. 1, the method of manufacturing the LED device includes step 110 to step 140. Each step will be described in detail below.

At step 110, an intermediate structure is manufactured, the intermediate structure includes a substrate and heterojunction structures 20, the substrate is provided with grooves 101, at least two of the grooves 101 have different depths; for each of the grooves 101, the groove 101 includes a first region 1011 and a second region 1012; a heterojunction structure 20 is provided in each groove 101, and the heterojunction structure 20 is disposed at the first region 1011 and the second region 1012.

In an embodiment, the substrate includes a substrate body 11 and partition walls 12, and the step 110 of manufacturing the intermediate structure includes steps S1101 to S1103.

At S1101, a substrate body 11 is provided.

At S1102, stair-step structures 111 are formed on the substrate body 11, and at least two of the stair-step structures 111 have different depths.

Figure 2:
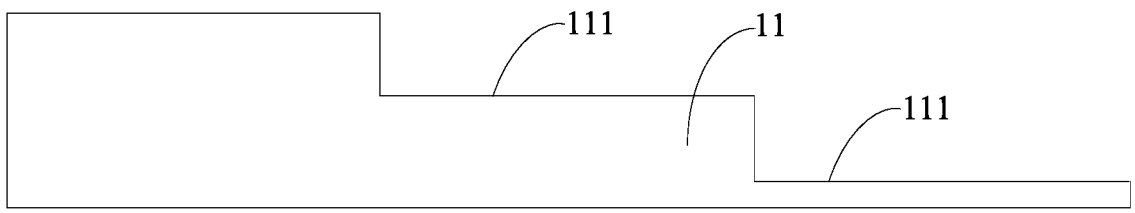
FIG. 2 is a structural diagram of a first intermediate structure of an LED device according to a first embodiment of the present disclosure.

Through steps S1101 to S1102, the first intermediate structure as shown in FIG. 2 can be obtained. As shown in FIG. 2, the substrate body 11 is provided with stair-step structures 111, and at least two of the stair-step structures 111 have different depths. In the embodiment shown in FIG. 2, depths of three adjacent stair-step structures 111 of the substrate body 11 are all different. The different depths of the stepped structures 111 mean that heights of top surfaces of the stepped structures 111 are different.

At S1103, heterojunction structures 20 are formed on the stair-step structures 111 respectively.

Figure 3:
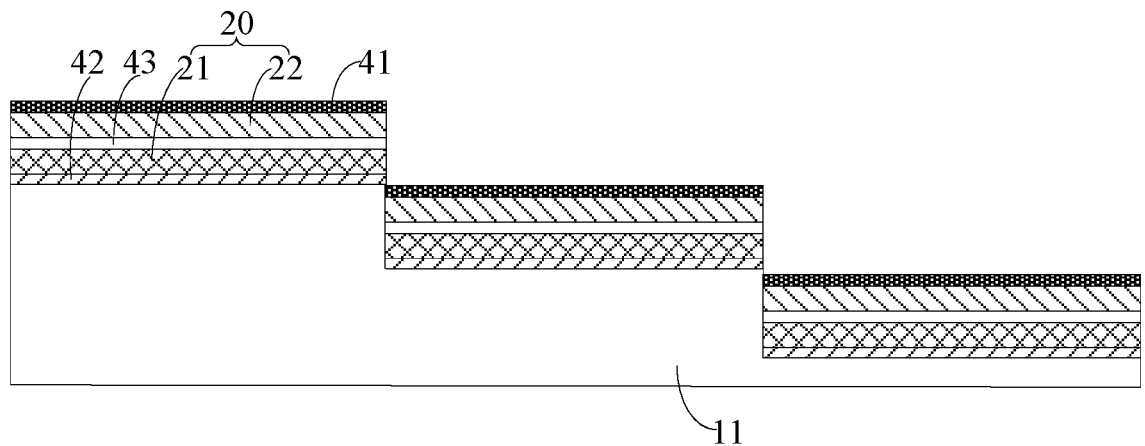
FIG. 3 is a structural diagram of a second intermediate structure of an LED device according to a first embodiment of the present disclosure.

In an embodiment, before the step of forming the heterojunction structures 20 on the stair-step structures 111 respectively, the step 110 of manufacturing the intermediate structure further includes: forming buffer layers 42 on the stair-step structures 111 respectively. As shown in FIG. 3, for each heterojunction structure 20, a buffer layer 42 is formed under the heterojunction structure 20.

In an embodiment, during the process of forming the heterojunction structures 20 on the stair-step structures 111 respectively, after forming a channel layer 21 of the heterojunction structure 20 and before forming a barrier layer 22 of the heterojunction structure 20, the step 110 of manufacturing the intermediate structure further includes: forming an insertion layer 43. As shown in FIG. 3, for each heterojunction structure 20, the insertion layer 43 is formed between the channel layer 21 and the barrier layer 22 of the heterojunction structure 20. In some embodiments, a material of the insertion layer 43 includes AlN, and the insertion layer 43 can increase a concentration of two-dimensional electron gas between the channel layer 21 and the barrier layer 22.

In an embodiment, after the step of forming the heterojunction structures 20 on the stair-step structures 111 respectively, that is, after step S1103, the step 110 of manufacturing the intermediate structure further includes: forming a cap layer 41. As shown in FIG. 3, for each heterojunction structure 20, a cap layer 41 is formed on the barrier layer 22 of the heterojunction structure 20.

In an embodiment, the buffer layer 42, the channel layer 21, the insertion layer 43, the barrier layer 22, and the cap layer 41 can all be formed by an epitaxial process, for example, a single epitaxial process.

And then, partition walls 12 are formed on edges of the substrate body 11 and the heterojunction structures 20, where the partition walls 12 are to separate the stair-step structures 111 respectively, and the partition walls 12 and the substrate body 11 form the grooves 101.

Figure 4:
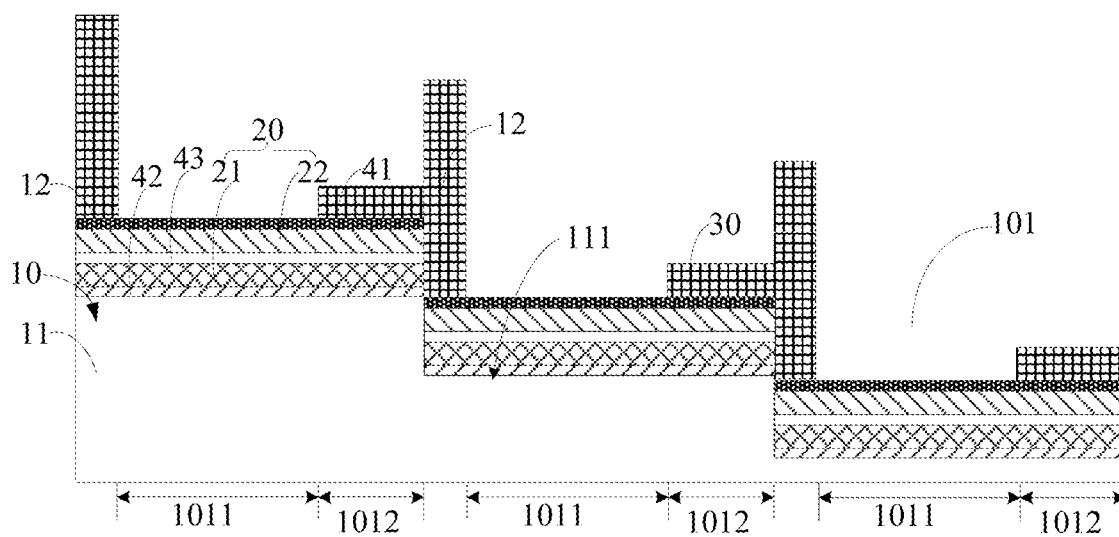
FIG. 4 is a structural diagram of an intermediate structure of an LED device according to a first embodiment of the present disclosure.

Through this step, an intermediate structure as shown in FIG. 4 can be obtained. As shown in FIG. 4, a partition wall 12 between adjacent stair-step structures 111 can be provided on the heterojunction structure 20 and to separate the adjacent heterojunction structures 20. The partition walls 12 and the substrate body 11 form the grooves 101. The stair-step structures 111 with different depths and the partition walls 12 form the grooves, and depths of the grooves are also different. Each groove 101 includes a first region 1011 and a second region 1012.

In an embodiment, the method of manufacturing the LED device further includes: forming a shielding layer 30 on the second region 1012, while forming the partition walls 12 on the edges of the substrate body 11 and the heterojunction structures 20. As shown in FIG. 4, the shielding layer 30 is provided in the second region 1012. The shielding layer 30 and the partition walls 12 are formed in a same process, which helps to simplify a complexity of the method of manufacturing the LED device.

In an embodiment, materials of the partition walls 12 include silicon dioxide. The silicon dioxide material can be deposited on the second intermediate structure first to form a whole-surface silicon dioxide film layer, and then the silicon dioxide film layer is patterned to form the partition walls 12 and the shielding layers 30.

At step 120, for each groove 101, a light emitting unit 50 is formed on the heterojunction structure 20 in the groove 101, the light emitting unit 50 is provided in the first region 1011, and includes a first semiconductor layer 51, a light emitting layer 52 on the first semiconductor layer 51, and a second semiconductor layer 53 on the light emitting layer 52, the first semiconductor layer 51 is provided on a surface of the heterojunction structure 20 away from the substrate; and the light emitting layers 52 in different grooves with different depths emit different colors.

Figure 5:
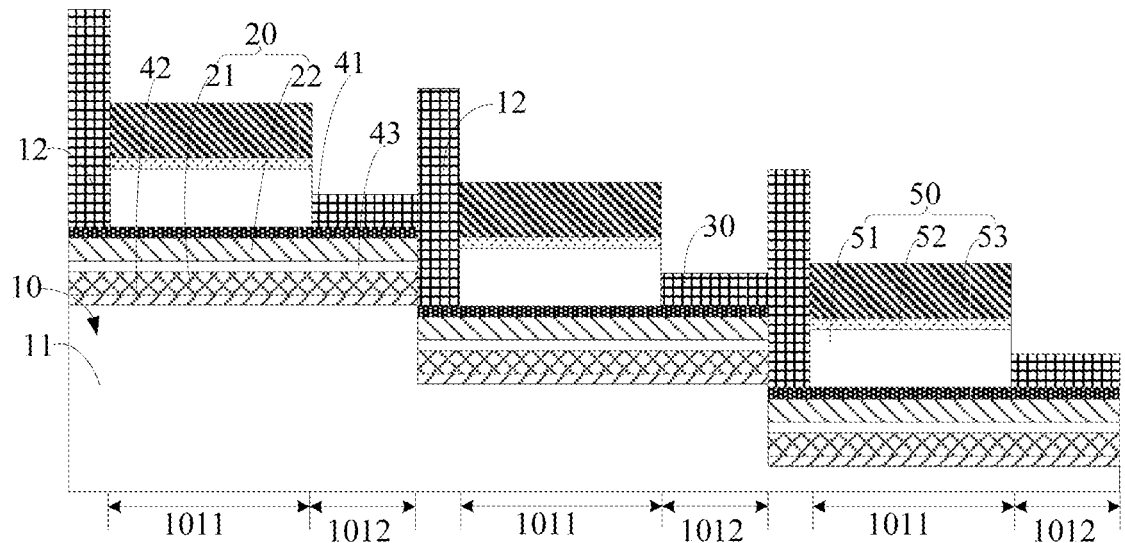
FIG. 5 is a structural diagram of a third intermediate structure of an LED device according to a first embodiment of the present disclosure.

In an embodiment, a third intermediate structure as shown in FIG. 5 can be obtained through step 120. As shown in FIG. 5, the first semiconductor layer 51, the light emitting layer 52 and the second semiconductor layer 53 are formed in the first region 1011 of each groove 101. The first semiconductor layer 51, the light emitting layer 52 and the second semiconductor layer 53 can all be formed by an epitaxial process, so the first semiconductor layer 51, the light emitting layer 52 and the second semiconductor layer 53 will not be formed on the shielding layer 30.

Figure 6:
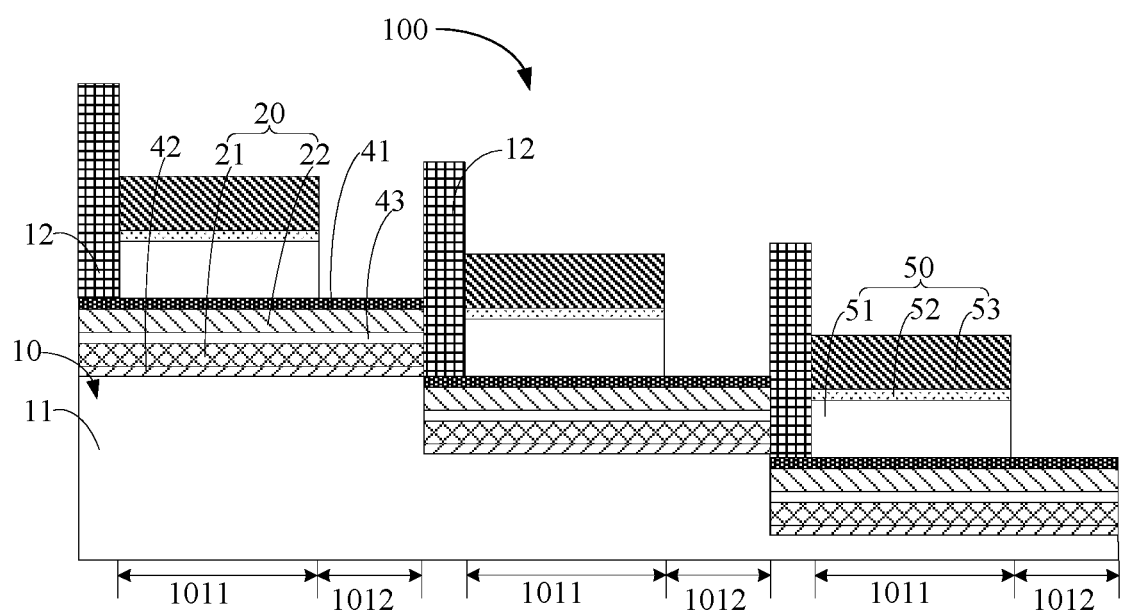
FIG. 6 is a structural diagram of a fourth intermediate structure of an LED device according to a first embodiment of the present disclosure.

In this embodiment, after the step 120 of forming the light emitting unit on the heterojunction structure 20 in each groove 101, the method of manufacturing the LED device further includes: removing the shielding layer 30. Through this step, a fourth intermediate structure as shown in FIG. 6 can be obtained. As shown in FIG. 6, after the shielding layer 30 is removed, a portion of the cap layer 41 in the second region 1012 is exposed.

In an embodiment, the shielding layer 30 in the second region 1012 can be removed by exposing and developing followed by dry etching.

In an embodiment, a conductivity type of the first semiconductor layer 51 is different from a conductivity type of the second semiconductor layer 53, one of the first semiconductor layer 51 and the second semiconductor layer 53 is an N-type semiconductor layer, and the other is a P-type semiconductor layer. A material of the N-type semiconductor layer and/or the P-type semiconductor layer can be a group III nitride material, and the group III nitride material can include at least one of GaN, AlGaN, InGaN, or AlInGaN. N-type ions in the N-type semiconductor layer can include at least one of silicon (Si) ions, germanium (Ge) ions, tin (Sn) ions, selenium (Se) ions, or tellurium (Te) ions. P-type ions in the P-type semiconductor layer can include at least one of magnesium (Mg) ions, zinc (Zn) ions, calcium (Ca) ions, strontium (Sr) ions, or barium (Ba) ions.

In an embodiment, the light emitting layer 52 can be at least one of a single quantum well structure, a multiple quantum well structure, a quantum wire structure or a quantum dot structure.

In an embodiment, a material of the light emitting layer 52 includes indium (In) element. When forming the light emitting layer 52, gas flow fields in the grooves 101 with different depths are different, such that doping concentrations of indium element in the light emitting layers 52 formed in the grooves 101 with different depths are different. Different doping concentration of the indium element in the light emitting layers make light emitting wavelengths of the light emitting layers 52 different, so the light emitting layers 52 in the grooves 101 with different depths emit different colors. In this way, the light emitting layers 52 emitting different colors can be formed at the same time. Compared with a scheme that the light emitting layers 52 emitting different colors are formed through different processes, the embodiments of the present disclosure can simplify the manufacturing process and reduce manufacturing cost.

In an embodiment, the substrate 10 can include three kinds of grooves 101 with different depths, and the manufactured LED device can include three kinds of light emitting units 50 emitting different colors. The light emitting units 50 can emit three colors including red, green and blue, respectively.

At step 130, in each groove 101, the heterojunction structure 20 is etched to obtain a first substructure 201 in the first region 1011 and a second substructure 202 in the second region 1012; in a same groove, the first substructure 201 and the second substructure 202 are arranged separately; and the second substructure 202 includes a gate region, and a source region and a drain region located on both sides of the gate region.

Figure 7:
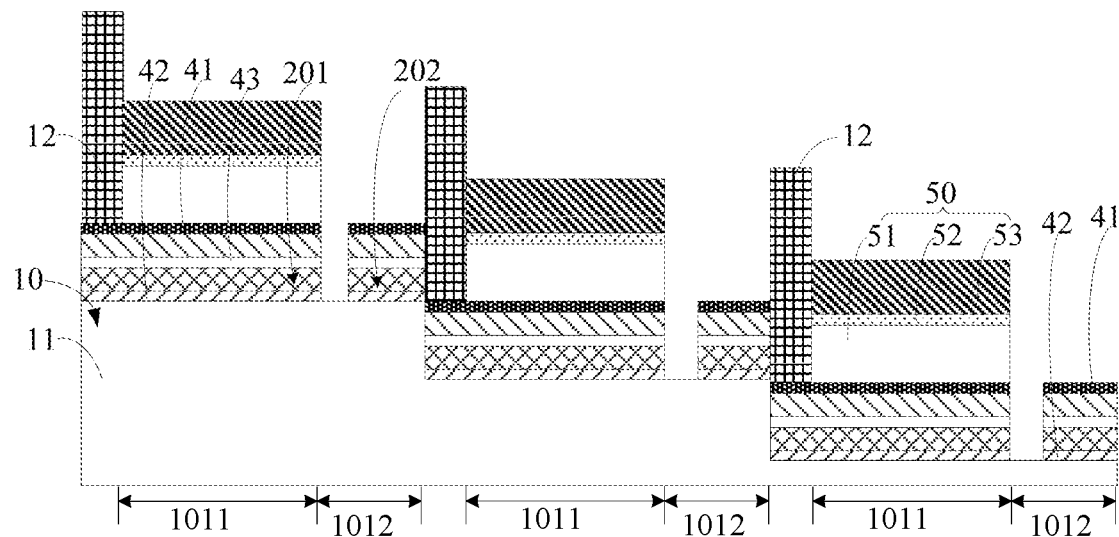
FIG. 7 is a structural diagram of a fifth intermediate structure of an LED device according to a first embodiment of the present disclosure.

Through step 130, a fifth intermediate structure as shown in FIG. 7 can be obtained. As shown in FIG. 7, the first substructure 201 in the first region 1011 and the second substructure 202 in the second region 1012 are arranged separately. While etching the heterojunction structure 20 in each groove 101, the buffer layer 42, the insertion layer 43 and the cap layer 41 are also etched; the buffer layer 42, the insertion layer 43 and the cap layer 41 are etched into two portions in the first region 1011 and the second region 1012 respectively; a portion of the buffer layer 42 in the first region 1011 and a portion of the buffer layer 42 in the second region 1012 are arranged separately; a portion of the insertion layer 43 in the first region 1011 and a portion of the insertion layer 43 in the second region 1012 are arranged separately; and a portion of the cap layer 41 in the first region 1011 and a portion of the cap layer 41 in the second region 1012 are arranged separately.

In an embodiment, the heterojunction structure 20, the buffer layer 42, the insertion layer 43 and the cap layer 41 in each groove 101 can be etched by exposing and developing followed by dry etching.

At step 140, a gate electrode 63, a source electrode 61, a drain electrode 62, a first electrode 71, a second electrode 72 and a connection wire 73 are formed in each groove 101; the gate electrode 63 is disposed on the gate region, and the source electrode 61 is disposed on the source region, the drain electrode 62 is disposed on the drain region; the first electrode 71 is electrically connected with the first semiconductor layer 51, the second electrode 72 is electrically connected with the second semiconductor layer 53, and in a same groove, the second electrode 72 is electrically connected with the source electrode 61 through the connection wire 73.

In an embodiment, the method of manufacturing the LED device further includes: before forming the source electrode 61 and the drain electrode 62, a portion of the cap layer 41 corresponding to the source region and a portion of the cap layer 41 corresponding to the drain region are annealed. By annealing the portions of the cap layer 41 corresponding to the source region and the drain region, good ohmic contacts can be formed between the source region of the cap layer 41 and the subsequently formed source electrode and between the drain region of the cap layer 41 and the subsequently formed drain electrode.

In an embodiment, the step 140 of forming the gate electrode 63, the source electrode 61, the drain electrode 62, the first electrode 71, the second electrode 72 and the connection wire 73 can include steps S1401 to S1404.

At S1401, a source electrode 61 and a drain electrode 62 are formed in the second region 1012, the source electrode 61 is disposed in the source region, and the drain electrode 62 is disposed in the drain region.

Figure 8:
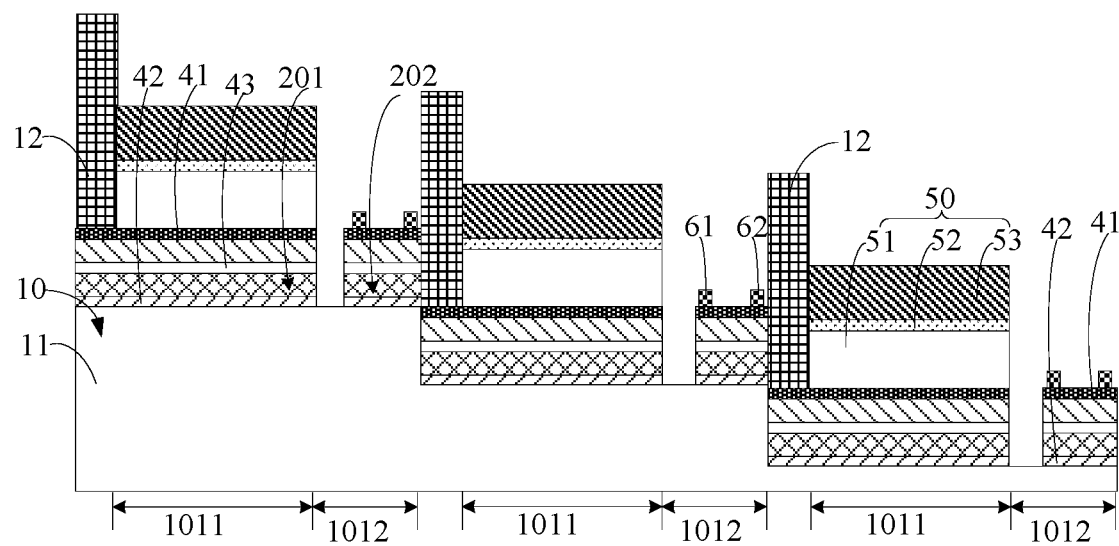
FIG. 8 is a structural diagram of a sixth intermediate structure of an LED device according to a first embodiment of the present disclosure.

Through this step, a sixth intermediate structure as shown in FIG. 8 can be obtained. As shown in FIG. 8, the source electrode 61 and the drain electrode 62 are provided in the second region 1012, the source electrode 61 is provided on a portion of the cap layer 41 corresponding to the source region, and the drain electrode 62 is provided on a portion of the cap layer 41 corresponding to the drain region.

At S1402, a gate insulating layer 64 is formed on the gate region.

Figure 9:
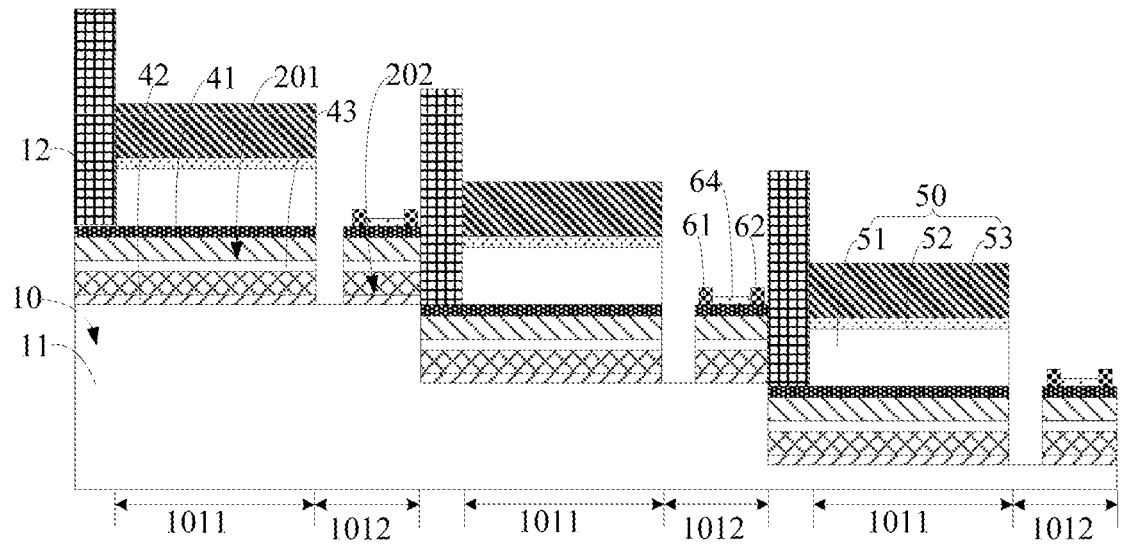
FIG. 9 is a structural diagram of a seventh intermediate structure of an LED device according to a first embodiment of the present disclosure.

Through this step, a seventh intermediate structure as shown in FIG. 9 can be obtained. As shown in FIG. 9, the gate insulating layer 64 is provided on the portion of the cap layer 41 corresponding to the gate region. In some embodiments, a material of the gate insulating layer 64 can include $SiO_2$, $SiN_x$ and the like.

At 51403, a gate electrode 63 is formed on the gate insulating layer 64.

Figure 10:
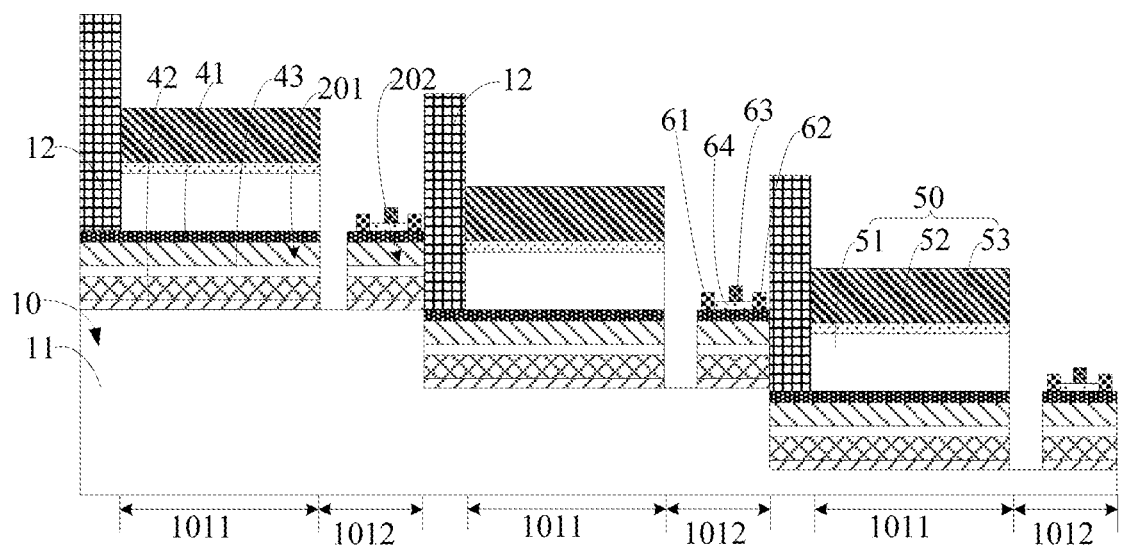
FIG. 10 is a structural diagram of an eighth intermediate structure of an LED device according to a first embodiment of the present disclosure.

Through this step, an eighth intermediate structure as shown in FIG. 10 can be obtained. As shown in FIG. 10, the gate electrode 63 is provided on the gate insulating layer 64.

At S1404, a part of the light emitting layer 52 and a part of the second semiconductor layer 53 are etched away to expose a part of a surface of the first semiconductor layer 51.

Figure 11:
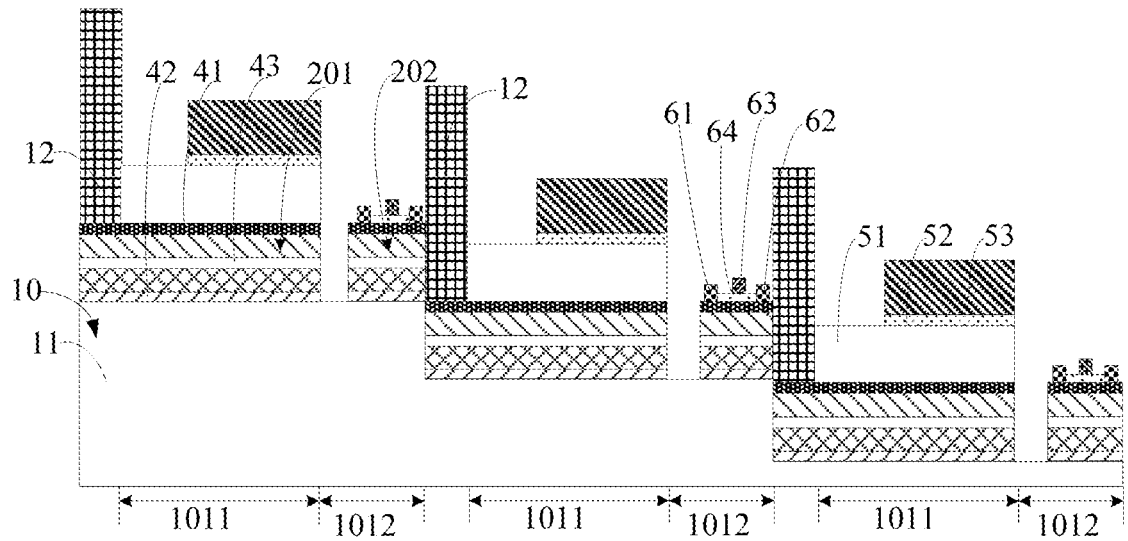
FIG. 11 is a structural diagram of a ninth intermediate structure of an LED device according to a first embodiment of the present disclosure.

Through this step, a ninth intermediate structure as shown in FIG. 11 can be obtained. As shown in FIG. 11, in each groove 101, a part of the light emitting layer 52 and a part of the second semiconductor layer 53 away from the second substructure 202 can be etched. After the part of the light emitting layer 52 and the part of the second semiconductor layer 53 away from the second substructure 202 are etched away, a part of a surface on the first semiconductor layer 51 away from the second substructure 202 is exposed.

Figure 12:
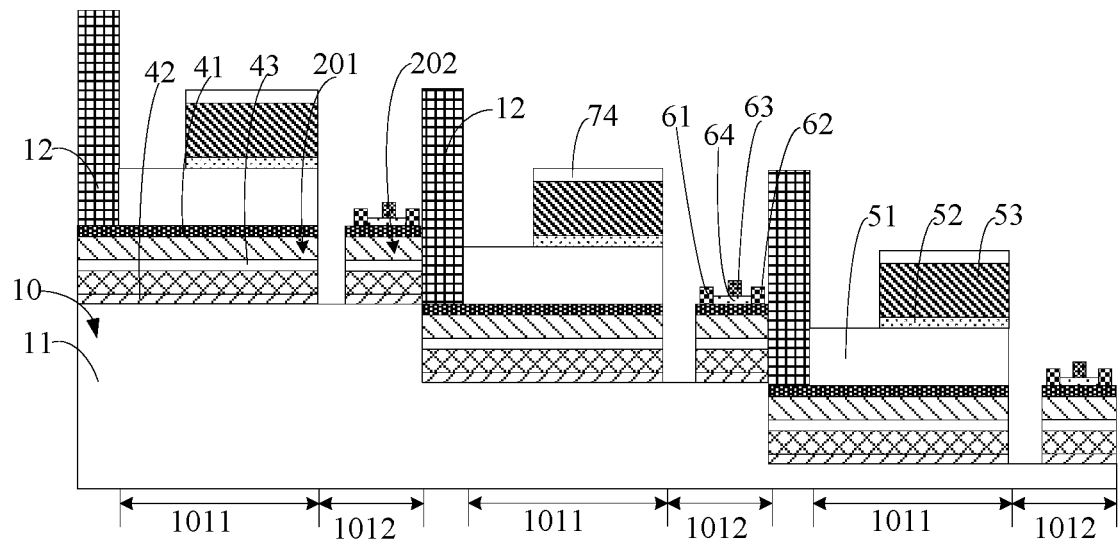
FIG. 12 is a structural diagram of a tenth intermediate structure of an LED device according to a first embodiment of the present disclosure.

In an embodiment, before forming the first electrode 71, the second electrode 72 and the connection wire 73 in each groove, the method of manufacturing the LED device further includes: forming an ohmic contact layer 74 on the second semiconductor layer 53. Through this step, a tenth intermediate structure as shown in FIG. 12 can be obtained. As shown in FIG. 12, the ohmic contact layer 74 is located on the second semiconductor layer 53. An orthographic projection of the ohmic contact layer 74 on the second semiconductor layer 53 coincides with the second semiconductor layer 53. A material of the ohmic contact layer 74 can be a transparent conductive material, such as indium tin oxide, indium zinc oxide, and the like.

Subsequently, an insulating layer 81 is formed.

Figure 13:
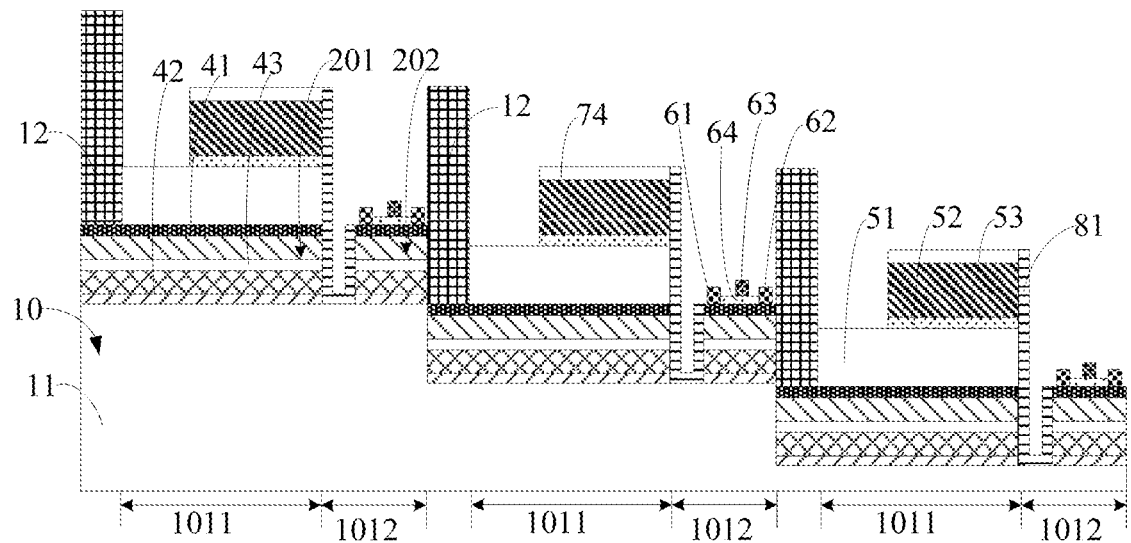
FIG. 13 is a structural diagram of an eleventh intermediate structure of an LED device according to a first embodiment of the present disclosure.

Through this step, an eleventh intermediate structure as shown in FIG. 13 can be obtained. As shown in FIG. 13, in the same groove 101, the insulating layer 81 includes a first part located on a side of the light emitting unit 50 and a side of the first substructure 201 facing towards the second substructure 202, a second part located on a side of the second substructure 202 facing towards the first substructure 201, and a third part located on the substrate 10 and between the first part and the second part. In some embodiments, a material of the insulating layer 81 can include $SiO_2$, $SiN_x$ and the like.

Subsequently, a first electrode 71, a second electrode 72 and a connection wire 73 are formed in each groove, the first electrode 71 is formed on the exposed surface of the first semiconductor layer 51, the second electrode 72 is formed on the second semiconductor layer 53, the second electrode 72 is electrically connected with the source electrode 61 through the connection wire 73.

Figure 14:
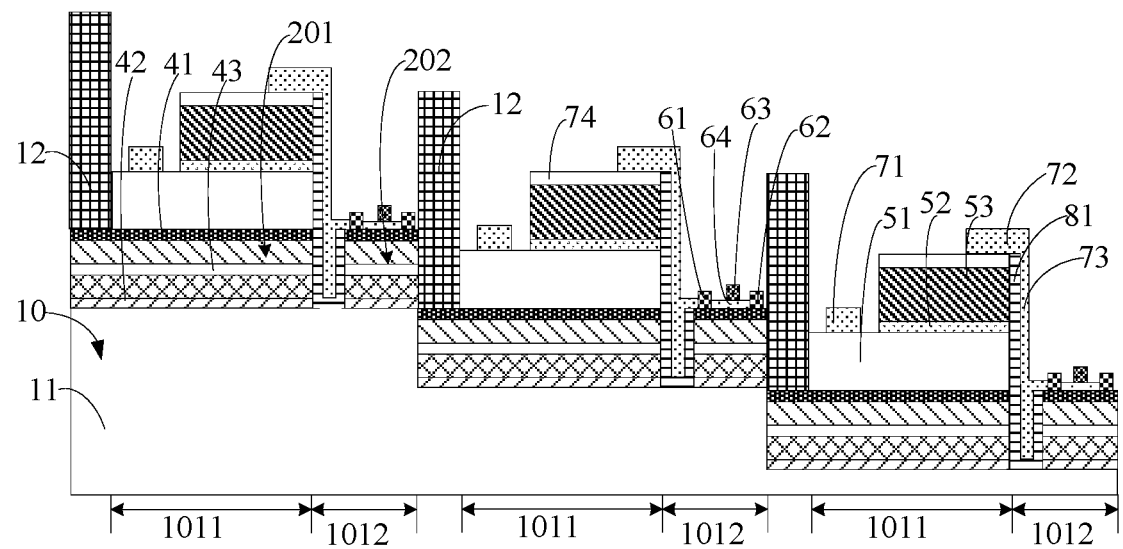
FIG. 14 is a structural diagram of a twelfth intermediate structure of an LED device according to a first embodiment of the present disclosure.

Through this step, a twelfth intermediate structure as shown in FIG. 14 can be obtained. As shown in FIG. 14, the first electrode 71 is in direct contact with the first semiconductor layer 51; the second electrode 72 is in direct contact with the ohmic contact layer 74, and is electrically connected with the second semiconductor layer 53 through the ohmic contact layer 74; the connection wire is disposed between a first portion and a second portion of the insulating layer 81. The first portion of the insulating layer 81 is located between both sides of the light emitting unit 50 and the first substructure 201 and the connection wire 73, and the second portion of the insulating layer 81 is located between a side of the second substructure 202 and the connection wire 73, a third portion of the insulating layer 81 is located between the connection wire 73 and the substrate 10. The insulating layer 81 can insulate the connection wire 73 from the first substructure 201, the second substructure 202 and the light emitting unit 50. The first electrode 71, the second electrode 72 and the connection wire 73 can be formed simultaneously in a same process.

In an embodiment, after the first electrode 71, the second electrode 72 and the connection wire 73 are formed in each groove, the method of manufacturing the LED device further includes: forming a passivation protection layer 82 in each groove, where the passivation protection layer 82 covers the exposed surface of the first semiconductor layer 51 and the exposed surface of the ohmic contact layer 74, and covers side portions of the light emitting layer 52, the second semiconductor layer 53 and the ohmic contact layer 74 away from the second substructure 202.

Figure 15:
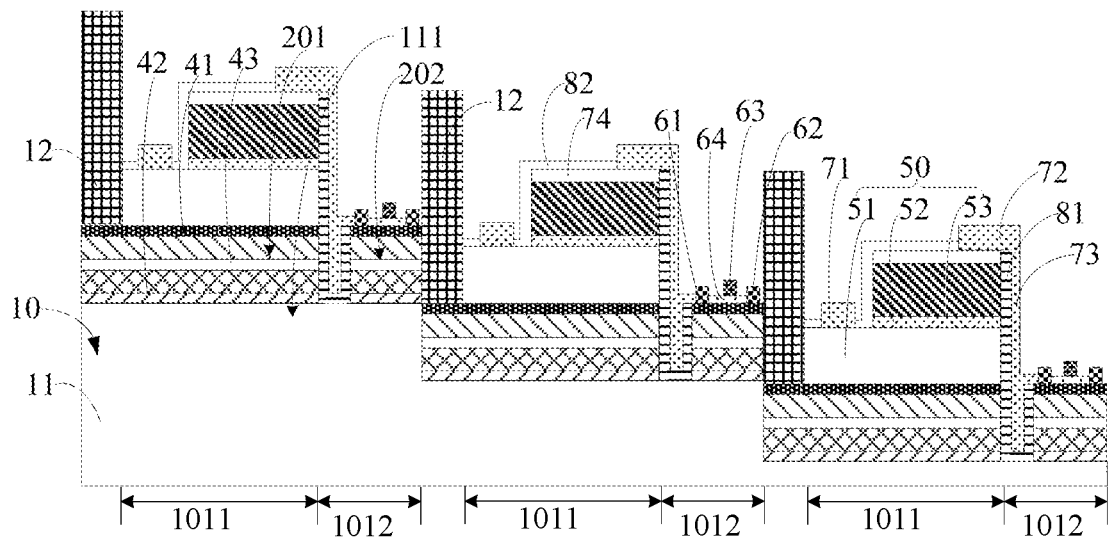
FIG. 15 is a structural diagram of semiconductor structure of an LED device according to a first embodiment of the present disclosure.

Through this step, a semiconductor structure as shown in FIG. 15 can be obtained. The passivation protection layer 82 can protect the device structure. In some embodiments, a material of the passivation protection layer 82 can include $SiO_2$, $SiN_x$, $Al_2O_3$ and the like.

In an embodiment, after the semiconductor structure is obtained after step 140, the method of manufacturing the LED device further includes: cutting the obtained semiconductor structure to obtain a plurality of LED devices, each of the plurality of LED devices includes a plurality of grooves, and depths of the plurality of grooves in a same LED device are different. In addition, for example, in the LED device in FIG. 20, the depths of the grooves are also different.

In some embodiments, each of the LED devices can include three grooves, the depths of the three grooves are all different, and the light emitting units in the three grooves can emit colors including red, green, and blue, respectively; or each of the LED devices includes four grooves, and the depths of the four grooves are different, and the light emitting units in the four grooves can emit colors including red, yellow, green and blue, and the present disclosure is not limited thereto.

In the structure shown in FIG. 15, an LED structure and a control structure are formed in each groove. The LED structure includes a light emitting unit 50, an ohmic contact layer 74, a first electrode 71 and a second electrode 72, and the control structure includes a second substructure 202, a gate electrode 63, a source electrode 61 and a drain electrode 62. In a same groove, the source electrode 61 of the control structure is electrically connected with the second electrode 72 of the LED structure through the connection wire 73, such that the control structure can drive the LED structure.

In the method of manufacturing the LED device provided by the embodiments of the present disclosure, on the one hand, due to different depths of the grooves on the substrate, gas flow fields in the grooves with different depths are different when epitaxially growing the LED structure, and thus light emitting layers with different doping concentrations can be formed in different grooves respectively, that is, light emitting layers emitting different colors can be formed in the grooves with different depths at the same time, and light emitting layers emitting different colors can be formed on the same substrate at the same time, which helps to improve an efficiency of manufacturing the LED; on the other hand, when the LED structure is transferred, the light emitting units emitting different colors in the same LED structure can be transferred synchronously. Compared with the scheme that LED structures emitting different colors need to be transferred separately, the transfer efficiency of the present disclosure can be improved.

The method of manufacturing the LED device provided by the embodiments of the present disclosure can simultaneously manufacturing the LED structure and the control structure for driving the LED structure, and can realize an electrical connection between the control structure and the corresponding LED structure. Compared with the scheme of transferring the LED structure to a circuit board with a drive circuit, and then connecting the LED structure with the corresponding drive circuit, the process steps can be simplified.

Second Embodiment

The method of manufacturing the LED device in the second embodiment of the present disclosure is substantially the same as the method of manufacturing the LED device in the first embodiment of the present disclosure, except that the substrate body 11 and the partition walls 12 are integrally formed, the step 110 of manufacturing the intermediate structure and the step 120 of manufacturing the light emitting unit are different.

In this embodiment, the step 110 of manufacturing the intermediate structure includes step S1111 to step S1113.

At S1111, a substrate 10 is provided.

At S1112, grooves 101 are formed on a side of the substrate 10, at least two of the grooves 101 have different depths.

Figure 16:
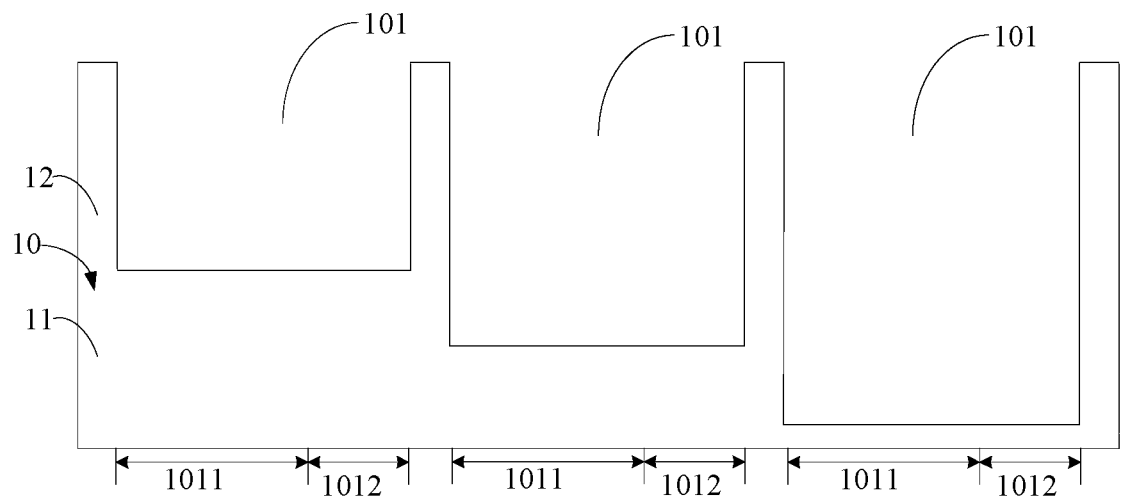
FIG. 16 is a structural diagram of a thirteenth intermediate structure of an LED device according to a second embodiment of the present disclosure.

Through steps S1111 to S1112, a thirteenth intermediate structure as shown in FIG. 16 can be obtained. The grooves 101 can be formed by etching the substrate 10. As shown in FIG. 16, each groove 101 includes a first region 1011 and a second region 1012.

At S1113, a heterojunction structure 20 is formed in each of the grooves 101.

Figure 17:
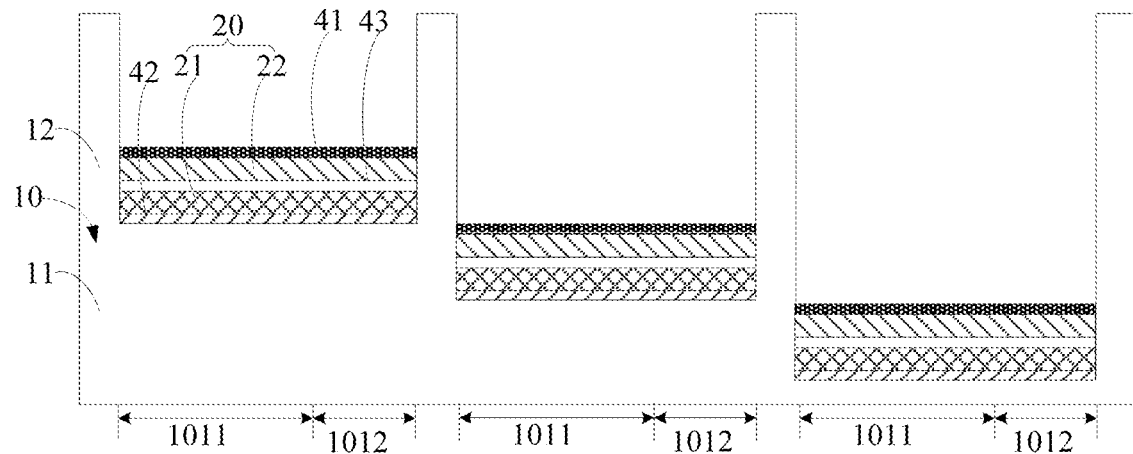
FIG. 17 is a structural diagram of an intermediate structure of an LED device according to a second embodiment of the present disclosure.

In this embodiment, the intermediate structure manufactured through steps S1111 to S1113 is shown in FIG. 17.

In this embodiment, the step 120 of forming the light emitting unit 50 on the heterojunction structure 20 in each groove 101 includes steps S1211 to S1212.

At S1211, the first semiconductor layer 51, the light emitting layer 52 and the second semiconductor layer 53 are formed sequentially in each groove 101, the first semiconductor layer 51, the light emitting layer 52 and the second semiconductor layer 53 are provided both in the first region 1011 and the second region 1012.

Figure 18:
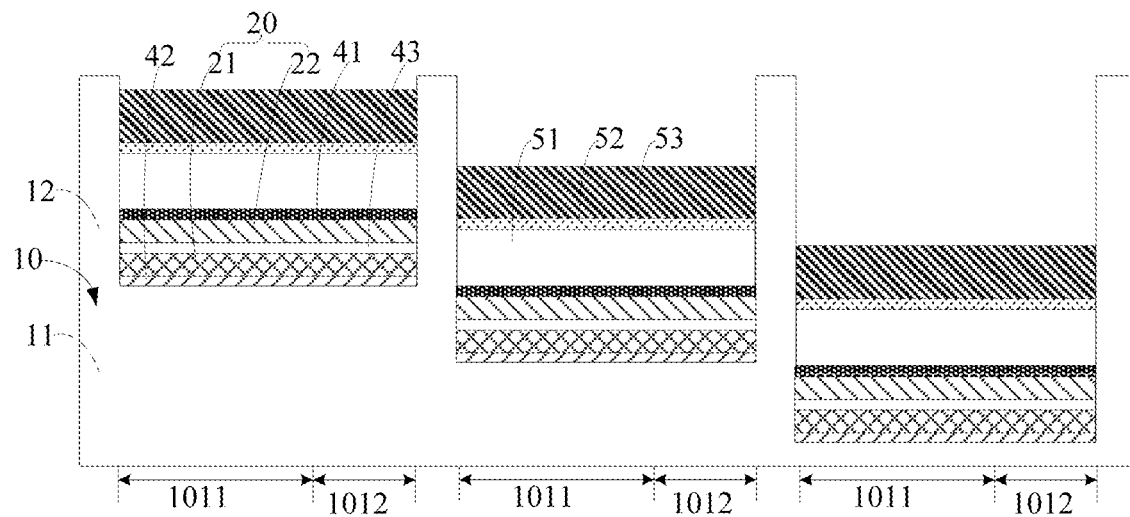
FIG. 18 is a structural diagram of a fourteenth intermediate structure of an LED device according to a second embodiment of the present disclosure.

Through this step, a fourteenth intermediate structure as shown in FIG. 18 can be obtained. As shown in FIG. 18, the first semiconductor layer 51, the light emitting layer 52 and the second semiconductor layer 53 cover the heterojunction structure 20 in each groove 101.

At S1212, portions of the first semiconductor layer 51, the light emitting layer 52 and the second semiconductor layer 53 in the second region 1012 are removed away.

Figure 19:
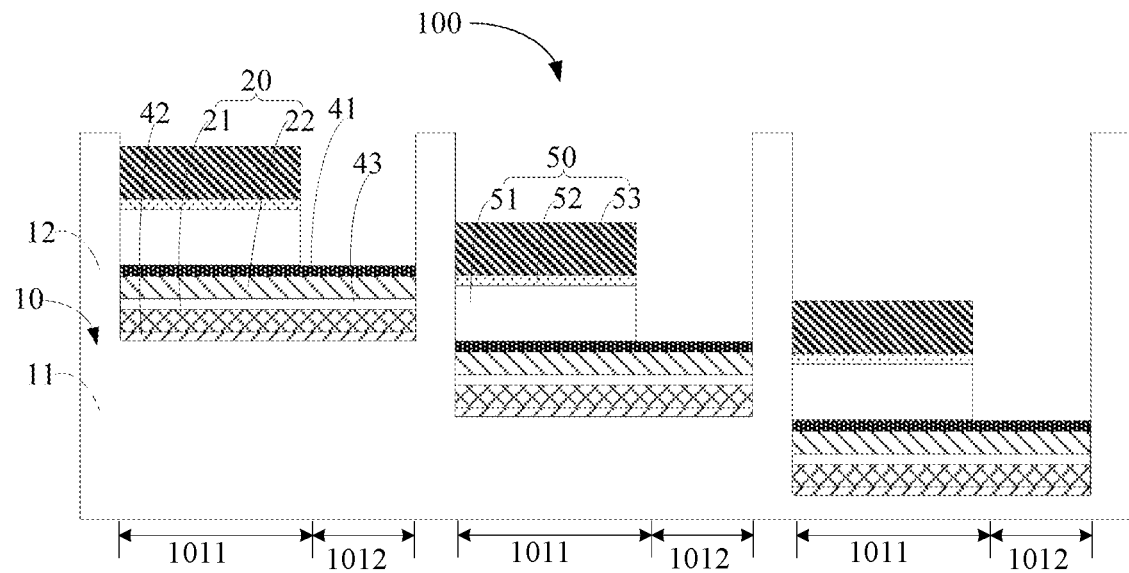
FIG. 19 is a structural diagram of a fifteenth intermediate structure of an LED device according to a second embodiment of the present disclosure.

Through this step, a fifteenth intermediate structure as shown in FIG. 19 can be obtained. As shown in FIG. 19, portions of the first semiconductor layer 51, the light emitting layer 52 and the second semiconductor layer 53 in the second region 1012 are removed away, and portions of the first semiconductor layer 51, the light emitting layer 52 and the second semiconductor layer 53 in the first region 1011 are remained. The portions of the first semiconductor layer 51, the light emitting layer 52 and the second semiconductor layer 53 in the second region 1012 can be removed away by exposing and developing followed by dry etching.

In this embodiment, the buffer layer 42, the channel layer 21, the insertion layer 43, the barrier layer 22, the cap layer 41, the first semiconductor layer 51, the light emitting layer 52 and the second semiconductor layer 53 can be formed by a single epitaxial process.

Figure 20:
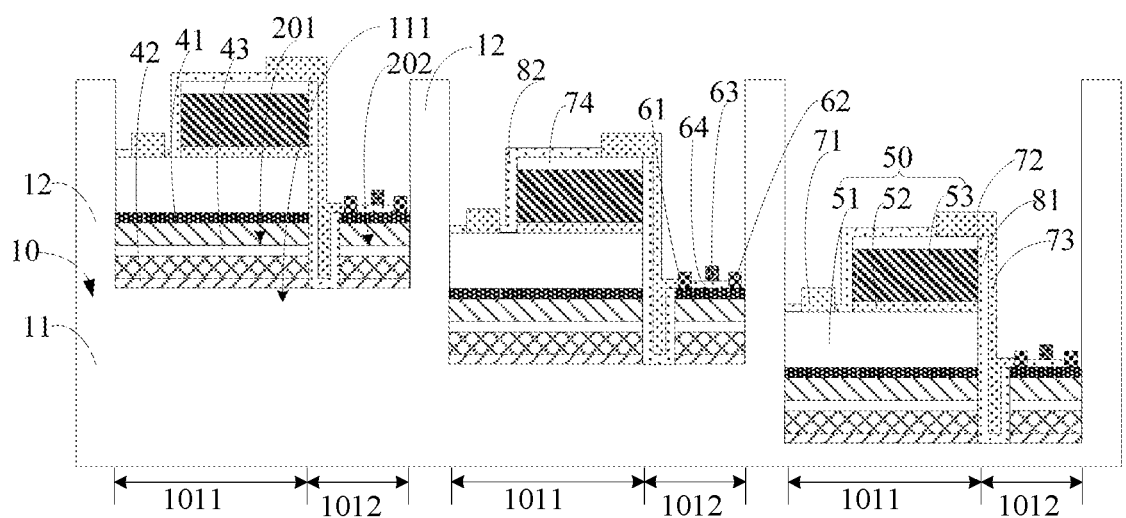
FIG. 20 is a structural diagram of a semiconductor structure of an LED device according to a second embodiment of the present disclosure.

In this embodiment, the final manufactured semiconductor structure is shown in FIG. 20. Depths of the grooves in FIG. 20 are all different, and the semiconductor structure including three grooves shown in FIG. 20 is an LED device including three light emitting units emitting different colors.

Third Embodiment

The method of manufacturing the LED device in the third embodiment of the present disclosure is substantially the same as the method of manufacturing the LED device in the first embodiment of the present disclosure, except that: at step 140, the forming process of the gate electrode, the source electrode, the drain electrode, the first electrode, the second electrode and the connection wire in each groove can be different from the forming process in the first embodiment.

In the embodiment of the present disclosure, the process of forming the gate electrode, the source electrode, the drain electrode, the first electrode, the second electrode and the connection wire in each groove includes: forming the gate insulating layer 64, the insulating layer 81 and the passivation protection layer 82 on corresponding positions, and forming the gate electrode 63, the source electrode 61, the drain electrode 62, the first electrode 71, the second electrode 72 and the connection wire 73 on corresponding positions. The gate insulating layer 64, the insulating layer 81 and the passivation protection layer 82 can be formed simultaneously in a same process, the gate electrode 63, the source electrode 61, the drain electrode 62, the first electrode 71, the second electrode 72 and the connection wire 73 can be formed simultaneously in a same process. In this way, it helps to simplify the process of manufacturing the LED device.

Fourth Embodiment

The method of manufacturing the LED device in the fourth embodiment of the present disclosure is substantially the same as the method of manufacturing the LED device in the first embodiment of the present disclosure, except that:

at step 140, the forming process of the gate electrode, the source electrode, the drain electrode, the first electrode, the second electrode and connection wire in each groove can be different from the forming process in the first embodiment.

In the embodiment of the present disclosure, the process of forming the gate electrode, the source electrode, the drain electrode, the first electrode, the second electrode and the connection wire in each groove includes: forming the source electrode 61, the drain electrode 62, the first electrode 71, the second electrode 72 and the connection wire 73 in each groove, forming the gate insulating layer 64, the insulating layer 81 and the passivation protection layer 82, and forming the gate electrode 63 in each groove. The source electrode 61, the drain electrode 62, the first electrode 71, the second electrode 72 and the connection wire 73 can be formed simultaneously in a same process, and the gate insulating layer 64, the insulating layer 81 and the passivation protection layer 82 can be formed simultaneously in a same process. In this way, it helps to simplify the process of manufacturing the LED device.

Fifth Embodiment

The present disclosure provides an LED structure. As shown in FIG. 15, the LED structure includes a substrate 10, light emitting units 50, first electrodes 71 and second electrodes 72.

The substrate 10 is provided with grooves 101, and depths of the grooves 101 are different. A light emitting unit 50 is disposed in each groove 101, and includes a first semiconductor layer 51, a light emitting layer 52, and a second semiconductor layer 53 arranged in layers; the light emitting layers 52 in respective grooves 101 with different depths emit different colors. For each groove, a first electrode 71 is electrically connected with the first semiconductor layer 51, a second electrode 72 is electrically connected with the second semiconductor layer 53.

In the LED structure provided by the embodiments of the present disclosure, since the grooves of the substrate have different depths, when forming the light emitting layers, gas flow fields in the grooves with different depths are different, and thus light emitting layers with different doping concentrations can be formed in different grooves, that is, the light emitting layers emitting different colors can be formed simultaneously in grooves with different depths, and the light emitting layers emitting different colors can be formed on the same substrate at the same time, which is helpful to improve the efficiency of manufacturing the LED structure. When transferring the LED structure, the LED structure is the smallest transfer unit, that is, the light emitting units emitting different colors in a same LED structure are transferred synchronously, compared with the LED structures emitting different colors need to be transferred separately or respectively, the transfer efficiency can be improved.

In an embodiment, the substrate 10 includes a substrate body 11 and partition walls 12, the substrate body 11 is provided with stair-step structures 111, and at least two of the stair-step structures 111 have different depths. The partition walls 12 separate the stepped structures 111 respectively, and the partition walls 12 and the substrate body 11 form the grooves 101.

In an embodiment, as shown in FIG. 15, materials of the partition walls 12 are different from a material of the substrate body 11.

In an embodiment, the LED structure further includes an ohmic contact layer 74 on the second semiconductor layer 53, and the second electrode 72 is electrically connected with the second semiconductor layer 53 through the ohmic contact layer 74 in each groove 101.

For the description of relevant details and beneficial effects of the LED structure provided by the embodiments of the present disclosure, reference can be made to the description in the first embodiment, and details are not repeated here.

Sixth Embodiment

The LED structure in the sixth embodiment of the present disclosure is substantially the same as the LED structure in the fifth embodiment of the present disclosure, except that the partition walls 12 are integrally formed with the substrate body 11. The LED structure provided by the embodiment of the present disclosure is shown in FIG. 20.

Seventh Embodiment

Figure 21:
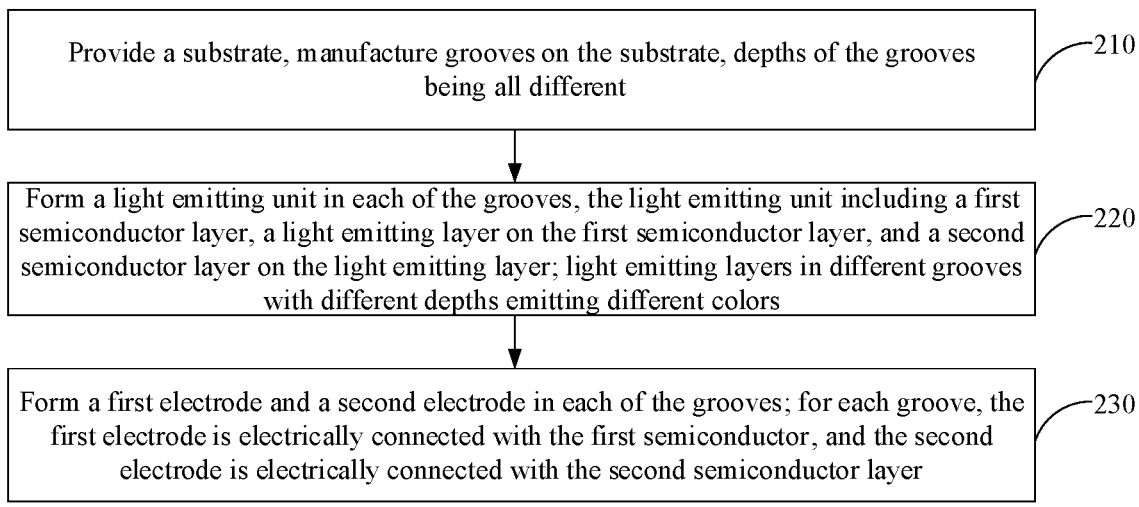
FIG. 21 is a flowchart of a method of manufacturing an LED structure according to a seventh embodiment of the present disclosure.

The seventh embodiment of present disclosure provides a method of manufacturing an LED device. As shown in FIG. 21, the method of manufacturing the LED structure includes following steps 210 to 230.

At step 210, a substrate is provided, grooves are manufactured on the substrate, and depths of the grooves are all different.

At step 220, a light emitting unit is formed in each of the grooves, the light emitting unit includes a first semiconductor layer, a light emitting layer on the first semiconductor, and a second semiconductor layer on the light emitting layer; light emitting layers in different grooves with different depths emit different colors.

At step 230, a first electrode and a second electrode are formed in each of the grooves; for each groove, the first electrode is electrically connected with the first semiconductor, and the second electrode is electrically connected with the second semiconductor layer.

Eighth Embodiment

The eighth embodiment of the present disclosure provides an LED device. As shown in FIG. 15 and FIG. 20, the LED device includes control structures, connection wires 73 and the LED structure described in fifth embodiment or sixth embodiment.

Each of the grooves 101 is provided with a control structure; the control structure includes a gate electrode 63, a source electrode 61 and a drain electrode 62, and the source electrode 61 and the drain electrode 62 are on both sides of the gate electrode 63; and in a same groove 101, the second electrode 72 is electrically connected with the source electrode 61 through a connection wire 73.

In an embodiment, each groove 101 includes a first region 1011 and a second region 1012; the LED device includes heterojunction structures 20 in respective grooves 101, and each of the heterojunction structures 20 includes a first substructure 201 in the first region 1011 and a second substructure 202 in the second region 1012, the first substructure 201 and the second substructure 202 in the same groove 101 are arranged separately.

The first substructure 201 is located below the light emitting unit 50, and the control structure includes the second substructure 202. The second substructure 202 includes a gate region, and a source region and a drain region located on both sides of the gate region; the gate electrode 63 is located in the gate region, and the source electrode 61 is located in the gate region, and the drain electrode 62 is located on the drain region.

In an embodiment, the heterojunction structure includes a channel layer 21 and a barrier layer 22 on the channel layer 21. The LED device further includes an insertion layer 43 between the channel layer 21 and the barrier layer 22.

In an embodiment, the LED device further includes a buffer layer 42 between the substrate 10 and the channel layer 21.

In an embodiment, the LED device further includes a cap layer 41 above the second substructure 202.

In an embodiment, the control structure further includes a gate insulating layer 64 on the gate region, and the gate insulating layer 64 is located between the gate electrode 63 and the second substructure 202. In some embodiments, the gate insulating layer 64 is located on the cap layer 41 corresponding to the gate region.

In an embodiment, the LED device further includes an insulating layer 81, and in a same groove 101, the insulating layer 81 includes a first portion between both a side of the light emitting unit 50 and a side of the first substructure 201 and the connection wire 73; a second portion between a side of the second substructure 202 and the connection wire 73; and a third portion between the connection wire 73 and the substrate 10.

In an embodiment, an area of the light emitting layer 52 or an area of the second semiconductor layer 53 are smaller than an area of the first semiconductor layer 51, a part of a surface on the first semiconductor layer 51 is exposed, and the first electrode 71 is located on an exposed surface of the first semiconductor layer 51.

In an embodiment, the LED device further includes an ohmic contact layer 74, the ohmic contact layer 74 is above the second semiconductor layer 53, and an orthographic projection of the ohmic contact layer 74 on the second semiconductor layer 53 is coincident with the second semiconductor layer 53. The second electrode 72 is electrically connected with the second semiconductor layer 53 through the ohmic contact layer 74.

In an embodiment, the LED structure further includes a passivation protection layer 82, the passivation protection layer 82 covers the exposed surface of the first semiconductor layer 51 and an exposed surface of the ohmic contact layer 74, and covers a side of the light emitting layer 52, a side of the second semiconductor layer 53 and a side of the ohmic contact layer 74 that are away from the second substructure 202.

The LED device in eighth embodiment of the present disclosure and the method of manufacturing the LED device in first embodiment have a same inventive concept, and descriptions of relevant details and beneficial effects can refer to each other.

Although the present disclosure discloses the above contents, the present disclosure is not limited thereto. Any one of ordinary skill in the art can make various variants and modifications to the present disclosure without departing from the spirit and scope of the present disclosure. Therefore, the protection scope of the present disclosure should be set forth by the appended claims.

What is claimed is:

1. A light emitting diode (LED) structure, comprising:
   a substrate; wherein the substrate is provided with grooves, and depths of the grooves are all different;
   light emitting units in the grooves and each comprising a first semiconductor layer, a light emitting layer on the first semiconductor layer and a second semiconductor layer on the light emitting layer, wherein light emitting layers in the grooves with different depths emit different colors;
   first electrodes and second electrodes; wherein for each groove, a first electrode in the groove is electrically connected with the first semiconductor layer in the groove, and a second electrode in the groove is electrically connected with the second semiconductor layer in the groove; and
   control structures with each of the control structures laterally beside a respective one of the light emitting units in a respective one of the grooves.

2. The LED structure according to claim 1, wherein the substrate comprises a substrate body and partition walls, and the substrate body is provided with stair-step structures, depths of at least two of the stair-step structures are different; the partition walls are to separate the stair-step structures respectively, and the partition walls and the substrate body form the grooves.

3. The LED structure according to claim 2, wherein materials of the partition walls are different from a material of the substrate body; or, the partition walls and the substrate body are integrally formed.

4. An LED device, further comprising, connection wires and the LED structure according to claim 1;
   wherein each of the control structures comprises a gate electrode, a source electrode and a drain electrode, and the source electrode and the drain electrode are disposed on both sides of the gate electrode; and in a same groove, the second electrode is electrically connected with the source electrode through a connection wire of the connection wires.

5. The LED device according to claim 4, wherein the LED device comprises a heterojunction structure disposed in each of the grooves, the heterojunction structure comprises a first substructure and a second substructure, the first substructure and the second substructure in a same groove are arranged separately;
   the first substructure is disposed under the light emitting unit, the control structure comprises the second substructure; the second substructure comprises a gate region, a source region and a drain region located on both sides of the gate region; the gate electrode is disposed on the gate region, the source electrode is disposed on the source region, and the drain electrode is disposed on the drain region.

6. The LED device according to claim 5, wherein the heterojunction structure comprises a channel layer and a barrier layer on the channel layer;
   the LED device further comprises an insertion layer between the channel layer and the barrier layer.

7. The LED device according to claim 5, wherein the LED device further comprises an insulating layer in each of the grooves, and in the same groove, the insulating layer comprises a first portion between both a side of the light emitting unit and a side of the first substructure and the connection wire, a second part between a side of the second substructure and the connection wire, and a third portion between the connecting wire and the substrate.

8. The LED device according to claim 5, wherein the control structure further comprises a cap layer above the second substructure; and the source electrode, the drain electrode and the gate electrode are above the cap layer.

9. A method of manufacturing a light emitting diode (LED) device of claim 4, comprising:
   manufacturing an intermediate structure, wherein the intermediate structure comprises a substrate and heterojunction structures, the substrate is provided with grooves, at least two of the grooves have different depths; for each of the grooves, the groove comprises a first region and a second region; each of the grooves is provided with a heterojunction structure, and the heterojunction structure is disposed in the first region and the second region;

forming a light emitting unit on the heterojunction structure in each of the grooves, wherein the light emitting unit is disposed in the first region, and comprises a first semiconductor layer, a light emitting layer on the first semiconductor layer and a second semiconductor layer on the light emitting layer, the first semiconductor layer is located on a surface of the heterojunction structure away from the substrate, the light emitting layers in different grooves with different depths emit different colors;

etching the heterojunction structure in each of the grooves to obtain a first substructure in the first region and a second substructure in the second region, wherein the first substructure and the second substructure in a same groove are separated, the second substructure comprises a gate region, and a source region and a drain region located on both sides of the gate region; and forming a gate electrode, a source electrode, a drain electrode, a first electrode, a second electrode, and a connection wire in each of the grooves; wherein the gate electrode is disposed on the gate region, the source electrode is disposed on the source region, and the drain electrode is disposed on the drain region, the first electrode is electrically connected with the first semiconductor layer, the second electrode is electrically connected with the second semiconductor layer, and in a same groove, the second electrode is electrically connected with the source electrode through the connection wire.

10. The method of manufacturing the LED device according to claim 9, wherein the substrate comprises a substrate body and partition walls; manufacturing the intermediate structure comprises:

providing a substrate body;

forming stair-step structures on the substrate body, wherein at least two of the stair-step structures have different depths;

forming heterojunction structures on respective stair-step structures; and forming the partition walls on edges of the substrate body and the heterojunction structures, wherein the partition walls are to separate the stair-step structures respectively, and the partition walls and the substrate body form the grooves.

11. The method of manufacturing the LED device according to claim 10, further comprising:

forming a shielding layer in the second region, while forming the partition walls on the edges of the substrate body and the heterojunction structures;

after forming the light emitting unit on the heterojunction structure in each groove, the manufacturing method of the LED device further comprises:

removing the shielding layer.

12. The method of manufacturing the LED device according to claim 9, wherein manufacturing the intermediate structure comprises:

providing the substrate;

forming the grooves on one side of the substrate, at least two of the grooves have different depths; and forming a heterojunction structure in each of the grooves respectively.

13. The method of manufacturing the LED device according to claim 12, wherein forming the light emitting unit on the heterojunction structure in each of the grooves comprises:

forming a first semiconductor layer, a light emitting layer, and a second semiconductor layer sequentially in the groove, wherein the first semiconductor layer, the light emitting layer, and the second semiconductor layer are located in the first region and the second region respectively; and removing the first semiconductor layer, the light emitting layer and the second semiconductor layer in the second region.

14. The method of manufacturing the LED device according to claim 9, wherein after etching the heterojunction structure to obtain the first substructure in the first region and the second substructure in the second region, and before forming the first electrode, the second electrode and the connection wire in each groove, the method of manufacturing the LED device further comprises:

forming an insulating layer, wherein in a same groove, the insulating layer comprises a first portion between both a side of the light emitting unit and a side of the first substructure and the connection wire, a second portion between a side of the second substructure and the connection wire, and a third part between the connecting line and the substrate.

15. The method of manufacturing the LED device according to claim 9, wherein the intermediate structure further comprises a cap layer on the heterojunction structure; the method of manufacturing the LED device further comprises: before forming the source electrode and the drain electrode, performing annealing process on the cap layer corresponding to the source region and the drain region.

16. The LED structure according to claim 1, wherein structures of the light emitting units in the grooves are the same, different doping concentration of an indium element in the light emitting layers make light emitting wavelengths of the light emitting layers different.

* * * * *